United States Patent
Chen et al.

(10) Patent No.: US 8,474,233 B2
(45) Date of Patent: Jul. 2, 2013

(54) OPTOELECTRONIC DEVICE AND THE MANUFACTURING METHOD THEREOF

(75) Inventors: Shih-I Chen, Hsinchu (TW); Chia-Liang Hsu, Hsinchu (TW); Tzu-Chieh Hsu, Hsinchu (TW); Chun-Yi Wu, Hsinchu (TW); Chien-Fu Huang, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/528,059

(22) Filed: Jun. 20, 2012

(65) Prior Publication Data

US 2012/0256164 A1  Oct. 11, 2012

Related U.S. Application Data

(62) Division of application No. 13/021,307, filed on Feb. 4, 2011, now Pat. No. 8,207,550.

(60) Provisional application No. 61/302,662, filed on Feb. 9, 2010.

(51) Int. Cl.
*H01L 33/06* (2010.01)

(52) U.S. Cl.
USPC ................................ 57/13; 257/13

(58) Field of Classification Search
USPC ...... 257/13, 79–103, 918, E51.018–E51.022, 257/E33.001–E33.032, E33.001–E33.077, 257/E33.054, E25.028, E25.032, 739, E29.069–E29.071, E29.245, E49.001–E49.004, 257/9, 14, E27.135, E27.138; 438/71, 665, 438/964, 16, 22–47, 69, 493, 503, 507, 956, 438/223–228
See application file for complete search history.

(56) References Cited

U.S. PATENT DOCUMENTS

| | | | |
|---|---|---|---|
| 5,804,836 A * | 9/1998 | Heeger et al. .................. 257/40 |
| 6,097,041 A | 8/2000 | Lin et al. | |
| 7,019,323 B2 | 3/2006 | Shakuda et al. | |
| 7,564,071 B2 | 7/2009 | Konno | |
| 7,692,203 B2 | 4/2010 | Konno | |
| 8,232,567 B2 * | 7/2012 | Dai et al. ........................ 257/94 |
| 2002/0079500 A1 | 6/2002 | Liu et al. | |
| 2003/0001162 A1 | 1/2003 | Udagawa | |

(Continued)

FOREIGN PATENT DOCUMENTS

| | | |
|---|---|---|
| CN | 1510765 | 7/2004 |
| JP | 2001036129 | 2/2001 |
| KR | 10-2009-0017200 | 2/2009 |
| WO | PCT/JP2006/303344 | * 11/2007 |

*Primary Examiner* — Dao H Nguyen
*Assistant Examiner* — Tram H Nguyen
(74) *Attorney, Agent, or Firm* — Muncy, Geissler, Olds & Lowe, PLLC

(57) ABSTRACT

An optoelectronic device has a substrate and a first window layer on the substrate with a first sheet resistance, a first thickness, and a first impurity concentration. A second window layer has a second sheet resistance, a second thickness, and a second impurity concentration. A semiconductor system is between the first window layer and the second window layer. The second window layer has a semiconductor material different from the semiconductor system, and the second sheet resistance is greater than the first sheet resistance. A method for manufacturing is provided, having the steps of providing a substrate, forming a semiconductor system on the substrate, and forming a window layer on the semiconductor system. The window layer has a semiconductor material different from the semiconductor system. Selectively removing the window layer forms a width difference greater than 1 micron between the window layer and semiconductor system.

19 Claims, 9 Drawing Sheets

U.S. PATENT DOCUMENTS

| | | |
|---|---|---|
| 2004/0075095 A1 | 4/2004 | Shakuda et al. |
| 2004/0211972 A1 | 10/2004 | Du et al. |
| 2005/0230701 A1 | 10/2005 | Huang |
| 2005/0236636 A1 | 10/2005 | Hon et al. |
| 2009/0039366 A1 | 2/2009 | Chiu |
| 2009/0218941 A1* | 9/2009 | Nakamura et al. ............ 313/506 |
| 2010/0078659 A1* | 4/2010 | Iizuka et al. .................... 257/94 |
| 2010/0218819 A1 | 9/2010 | Farmer et al. |
| 2010/0237357 A1* | 9/2010 | Tsai et al. ....................... 257/79 |
| 2011/0024781 A1 | 2/2011 | Fujimoto |
| 2011/0101404 A1 | 5/2011 | Fu et al. |
| 2011/0108879 A1 | 5/2011 | Huang et al. |
| 2011/0127551 A1 | 6/2011 | Pan et al. |

* cited by examiner

OPTOELECTRONIC DEVICE AND THE MANUFACTURING METHOD THEREOF

RELATED APPLICATION DATA

This application is a Divisional of U.S. application Ser. No. 13/021,307 filed on Feb. 4, 2011 now U.S. Pat. No. 8,207,550, for which priority is claimed under 35 USC 120; and this application claims priority of U.S. Provisional Application No. 61/302,662 filed on Feb. 9, 2010 under 35 USC 119(e), the contents of all of which are incorporated herein by reference.

BACKGROUND

Technical Field

The application relates to an optoelectronic device and the manufacturing method thereof.

Recently, efforts have been put to promote the luminous efficiency of the light-emitting diode (LED) in order to implement the device in the lighting field, and further conserve the energy and reduce carbon emission. The LED luminous efficiency can be increased through several aspects. One is to increase the internal quantum efficiency (IQE) by improving the epitaxy quality to enhance the combination efficiency of electrons and holes. Another is to increase the light extraction efficiency (LEE) that emphasizes on the increase of light which is emitted by the light-emitting layer capable of escaping outside the device, and therefore reducing the light absorbed by the LED structure.

SUMMARY

The present disclosure provides a novel structure and the manufacturing method thereof for increasing the light extraction efficiency.

One aspect of the present disclosure provides an optoelectronic device comprising a substrate; a first window layer on the substrate having a first sheet resistance, a first thickness, and a first impurity concentration; a second window layer having a second sheet resistance, a second thickness, and a second impurity concentration; and a semiconductor system between the first window layer and the second window layer; wherein the second window layer comprises a semiconductor material different from the semiconductor system, and the second sheet resistance is greater than the first sheet resistance.

One aspect of the present disclosure provides an optoelectronic device comprising a substrate; a metal layer comprising a metal element on the substrate; a first window layer comprising the metal element; and a transparent conductive layer between the metal layer and the first window layer; wherein an atomic concentration of the metal element in the first window layer is less than $1*10^{19}$ cm$^{-3}$.

One aspect of the present disclosure provides an optoelectronic device comprising a substrate; an n-type window layer on the substrate; a semiconductor system on the n-type window layer; a p-type window layer on the semiconductor system; wherein the optoelectronic device emits amber or red light with an optical efficiency at least 70 lumen/watt at a driving current density ranging from 0.1~0.32 mA/mil$^2$.

One aspect of the present disclosure provides a method for manufacturing an optoelectronic device in accordance with the present disclosure. The method comprises the steps of providing a substrate; forming a semiconductor system on the substrate; forming a window layer on the semiconductor system, wherein the window layer comprises a semiconductor material different from the semiconductor system; selectively removing the window layer thereby forming a width difference between the window layer and the semiconductor system, and the width difference is greater than 1 micron.

DETAILED DESCRIPTION OF PREFERRED EMBODIMENTS

Figure 1A:
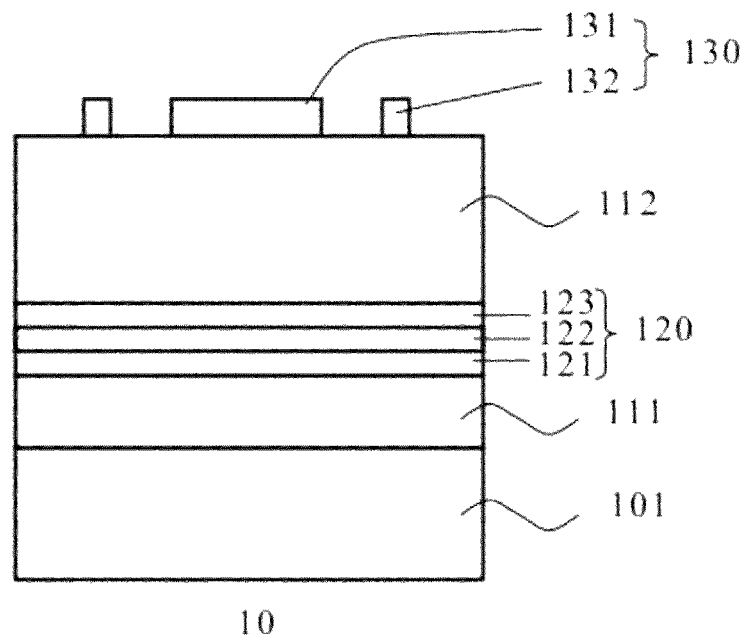
FIGS. 1A to 1H illustrate the corresponding structures fabricated by the manufacturing method step-by-step according to one embodiment of the present disclosure.

FIGS. 1A to 1H show the corresponding structures fabricated by the manufacturing method step-by-step according to one embodiment of the present disclosure. With reference to FIG. 1A, the method for manufacturing an optoelectronic device in accordance with the present disclosure comprises a step of providing a substrate 101, such as a growth substrate for growing or carrying an optoelectronic system 120, and the material for the substrate 101 includes but is not limited to germanium (Ge), gallium arsenide (GaAs), indium phosphide (InP), gallium phosphide (GaP), sapphire, silicon carbide (SiC), silicon (Si), lithium aluminum oxide (LiAlO$_2$), zinc oxide (ZnO), gallium nitride (GaN), aluminum nitride (AlN) glass, composite, diamond, CVD diamond, diamond-like carbon (DLC), and so on.

a first window layer 111 is formed on the substrate 101 made of a material containing at least one element selected from the group consisting of Al, Ga, In, As, P, and N, such as GaN, AlGaInP or any other suitable materials. The first window layer 111 is a layer with a conductivity-type, such as n-type or p-type $(Al_xGa_{(1-x)})_{0.5}In_{0.5}P$ where $0.5 \leq x \leq 0.8$. The first window layer 111 has two opposite surface wherein the first surface of the first window layer 111 is closer to the substrate 101.

A transition layer could be optionally formed between the substrate 101 and the first window layer 111. The transition layer between two material systems can be used as a buffer system. For the structure of the light-emitting diode, the transition layer is used to reduce the lattice mismatch between two material systems. On the other hand, the transition layer could also be a single layer, multiple layers, or a structure to combine two materials or two separated structures where the material of the transition layer can be organic, inorganic, metal, semiconductor, and so on, and the structure can be a reflection layer, a heat conduction layer, an electrical conduction layer, an ohmic contact layer, an anti-deformation layer, a stress release layer, a stress adjustment layer, a bonding layer, a wavelength converting layer, a mechanical fixing structure, and so on.

Next, the optoelectronic system 120 is formed on the second surface of the first window layer 111 including at least a first layer 121 having a first conductivity-type, a conversion unit 122, and a second layer 123 having a second conductivity-type in sequence. The first layer 121 and the second layer 123 are two single-layer structures or two multiple layers structure ("multiple layers" means two or more than two layers) having different conductivities, electrical properties, polarities, and/or dopants for providing electrons or holes respectively. If the first layer 121 and the second layer 123 are composed of semiconductor materials, such as $(Al_xGa_{(1-x)})_{0.5}In_{0.5}P$ where $0.5 \leq x \leq 0.8$, the first or second conductivity-type can be p-type or n-type. The first window layer 111 has the same conductivity-type with the first layer 121, such as n-type. Besides, the first window layer 111 has greater impurity concentration than the first layer 121 to have a better conductivity. The conversion unit 122 disposed between the first layer 121 and the second layer 123 is a region where the light energy and the electrical energy could transfer or could be induced to transfer. The optoelectronic system 120, such as applied to a semiconductor device, equipment, product, circuit, can proceed or induce the light energy and electrical energy transfer. Specifically speaking, the optoelectronic system includes at least one of a light-emitting diode (LED), a laser diode (LD), a solar cell, a liquid crystal display, or an organic light-emitting diode. The optoelectronic system having the conversion unit 122 transferring the electrical energy to the light energy is a light-emitting diode, a liquid crystal display, or an organic light-emitting diode. The optoelectronic system having the conversion unit 122 transferring the light energy to the electrical energy is a solar cell or an optoelectronic diode. The phrase "optoelectronic system" in the specification does not require that all the sub-systems or units in the system manufactured by semiconductor materials. Other non-semiconductor materials such as metal, oxide, insulator, and so on could also be selectively integrated in this optoelectronic system 120.

Taking the light-emitting diode as an example, the emission spectrum of the transferred light could be adjusted by changing the physical or chemical arrangement of one layer or more layers in the optoelectronic system 120. The commonly used materials are the series of aluminum gallium indium phosphide (AlGaInP), the series of aluminum gallium indium nitride (AlGaInN), the series of zinc oxide (ZnO), and so on. The conversion unit 122 can be a single hetero structure (SH) structure, a double hetero structure (DH) structure, a double-side double heterostructure (DDH) structure, or a multi-quantum well (MWQ) structure. Specifically, the conversion unit 122 comprises a MQW structure comprising a plurality of barrier layers and well layers alternately stacked, each of the barrier layers comprises $(Al_yGa_{(1-y)})_{0.5}In_{0.5}P$ where $0.5 \leq y \leq 0.8$; and each of the well layers comprises $In_{0.5}Ga_{0.5}P$. Besides, the wavelength of the emitted light could also be adjusted by changing the number of the pairs of the quantum well or the composition of the barrier layer, e.g. the emitted light is red light with dominant wavelength between 600 and 630 nm by having y around 0.7 or amber light with dominant wavelength between 580 and 600 nm by having y around 0.55.

Figure 3:
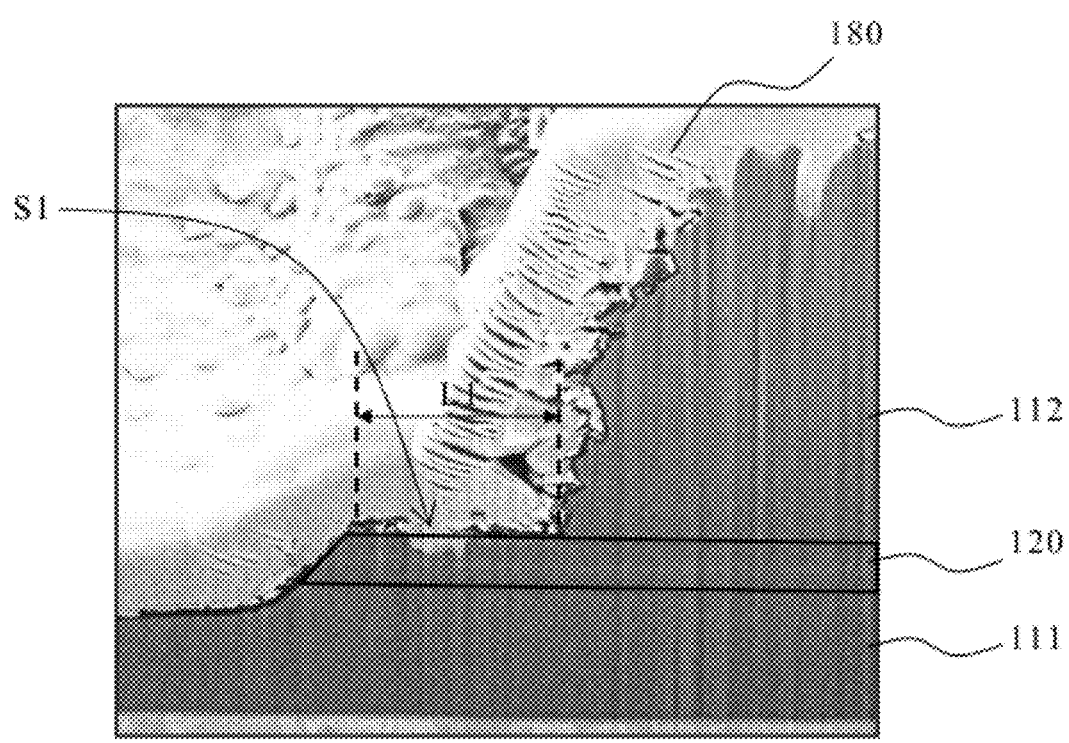
FIG. 3 illustrates an SEM photograph of the optoelectronic device in accordance with the present disclosure.

Forming a second window layer 112 on a first surface of the optoelectronic system 120 whose material contains at least one element selected from the group consisting of Al, Ga, In, As, P, and N, such as GaN, AlGaInP or any other suitable materials, and the second window layer 112 comprises at least one material different from the optoelectronic semiconductor system or the second layer 123. The second window layer 112 is preferred a layer with a conductivity-type the same with the second layer 123, such as a p-type GaP layer. In another embodiment, the sidewall of the second window layer 112 and/or the semiconductor system 120 need not be orthogonal to the substrate, but rather may be oblique thereto as indicated in FIG. 3.

Figure 4:
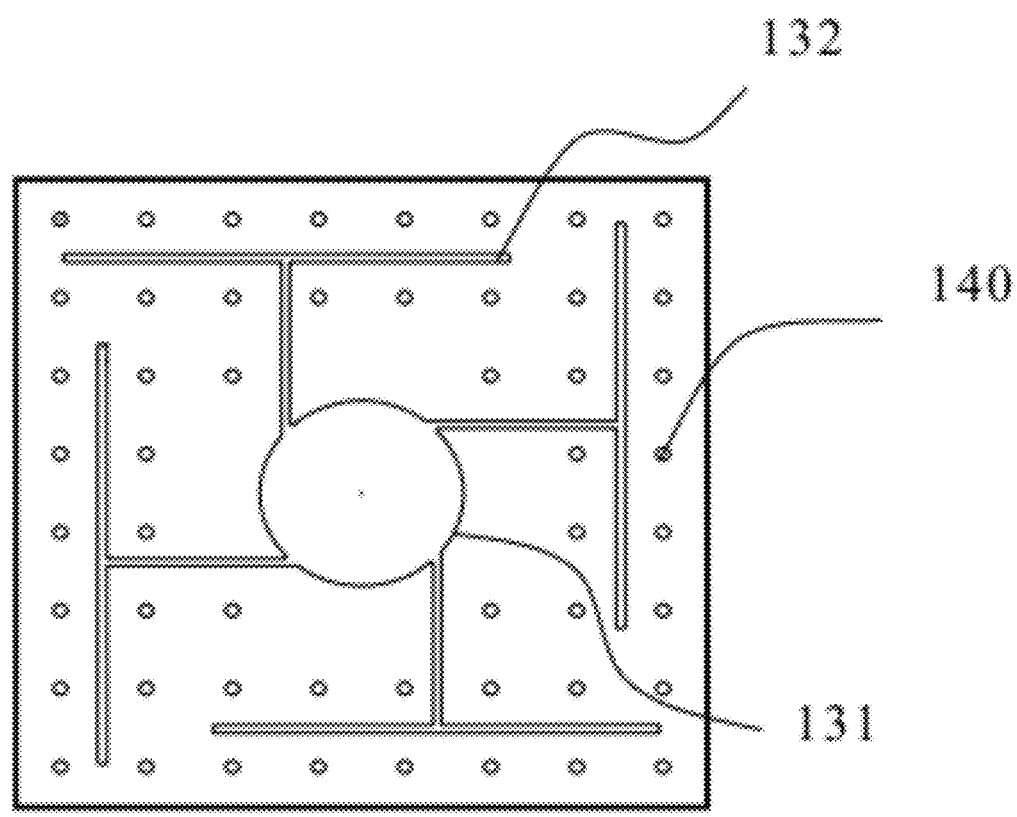
FIG. 4 illustrates a top view of the first ohmic contact layer.

Then, forming a first ohmic contact layer 130 formed by conductive material such as BeAu or GeAu alloy on the second window layer 112, and therefore forming a first stack 10 structure as shown in FIG. 1A, wherein the first ohmic contact layer 130 comprises a plurality of fingers 132 extending toward borders of the first stack 10 structure as shown in FIG. 4. A first alloying process is then performed at an alloying temperature of around 300~500° C. or more for forming an ohmic contact between the first ohmic contact layer 130 and the second window layer 112. The detail of the alloying process is well-known for those skilled in this field, and not necessarily disclosed herein.

Figure 1B:
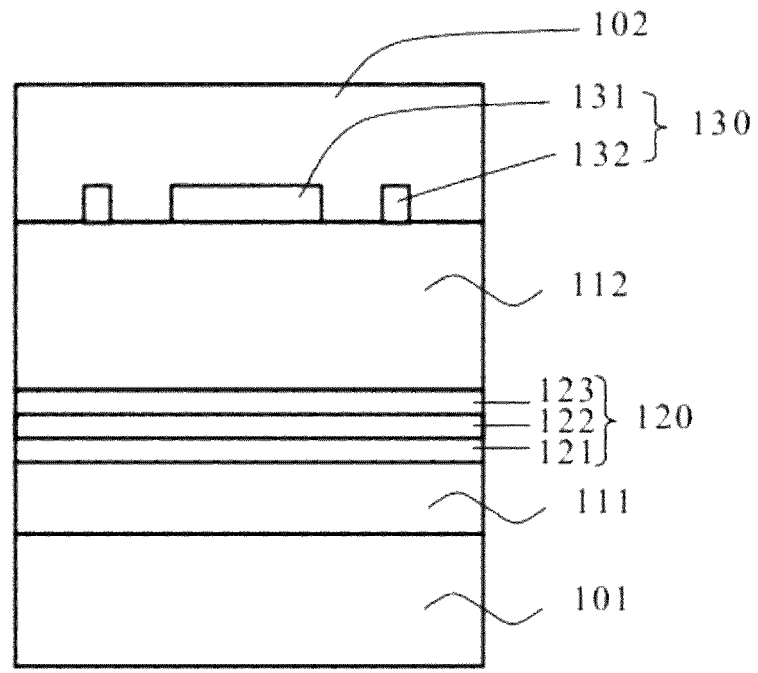
Figure 1C:
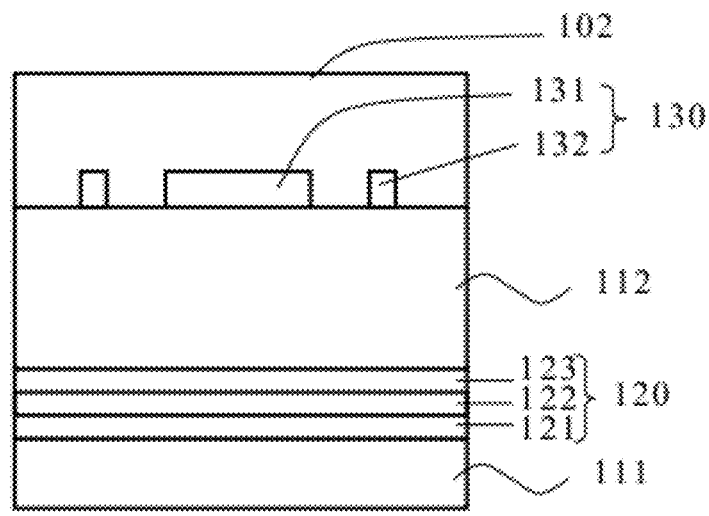

Next, bonding a temporary substrate 102 formed by supportive material such as glass to the first ohmic contact layer 130 and the second window layer 112 of the first stack structure 10 as shown in FIG. 1B, and removing the substrate 101, and therefore exposing the first surface of the first window layer 111 as shown in FIG. 1C.

Figure 1D:
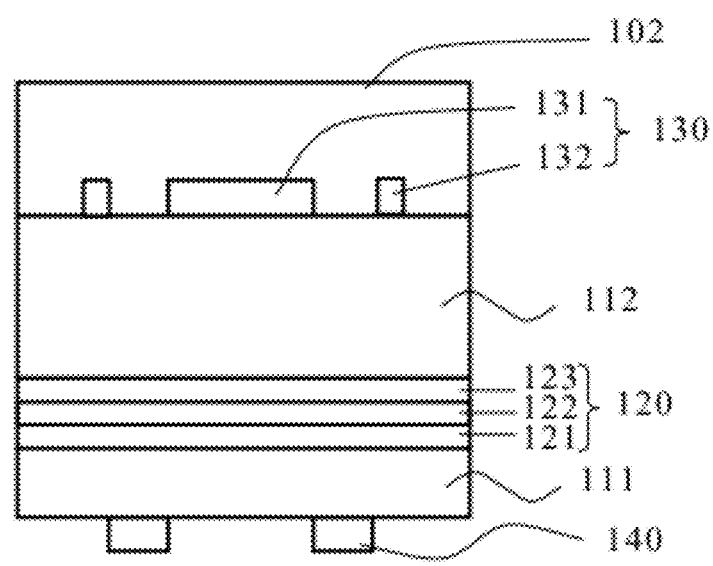

Next, forming a second ohmic contact layer 140 formed by conductive material like GeAu or BeAu alloy on the first surface of the first window layer 111, and therefore forming a second stack structure as shown in FIG. 1D, wherein the second ohmic contact layer 140 comprises a plurality of dots that are arranged in a two-dimensional array and is preferred substantially do not overlap with the first ohmic contact layer 130 in vertical direction as shown in FIGS. 1D and 4 for better current spreading effect. A second alloying process is then performed at an alloying temperature of around 300~500° C. or more for forming an ohmic contact between the second ohmic contact layer 140 and the first window layer 111. The detail of the alloying process is well-known for those skilled in this field, and not necessarily disclosed herein.

Next, a transparent conductive layer 141 is sequentially formed by e-beam or sputtering to cover the second ohmic contact layer 140, wherein the material of the transparent conductive layer 141 comprises metal oxide, such as at least one material selected from the group consisting of indium tin oxide (ITO), cadmium tin oxide (CTO), antimony tin oxide, indium zinc oxide, zinc aluminum oxide, and zinc tin oxide; and the thickness is about 0.005μm~0.6μm, 0.005 μm~0.5 μm, 0.005 μm~0.4 μm, 0.005 μm~0.3 μm, 0.005 μm~0.2 μm, 0.2 μm~0.5 μm, 0.3 μm~0.5 μm, 0.4 μm~0.5 μm, 0.2 μm~0.4 μm, or 0.2 μm~0.3 μm.

Figure 1E:
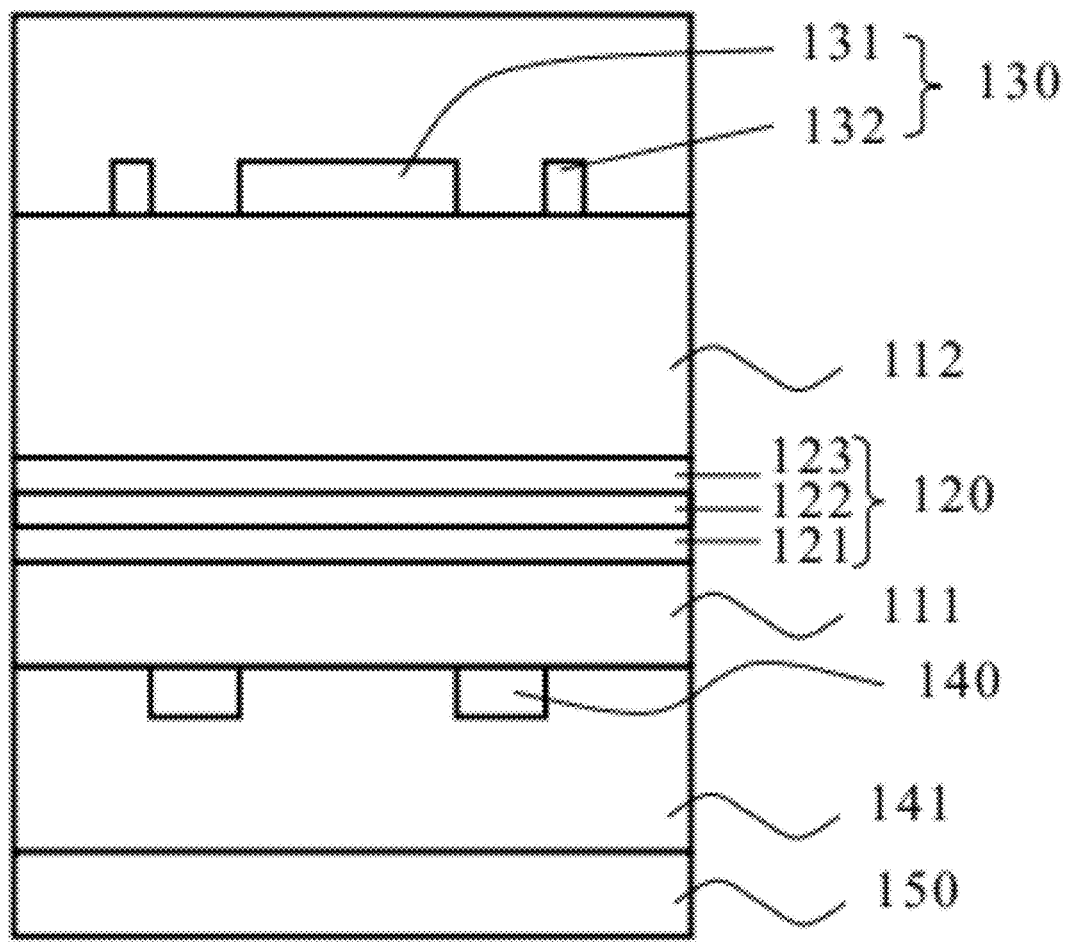
Figure 1F:
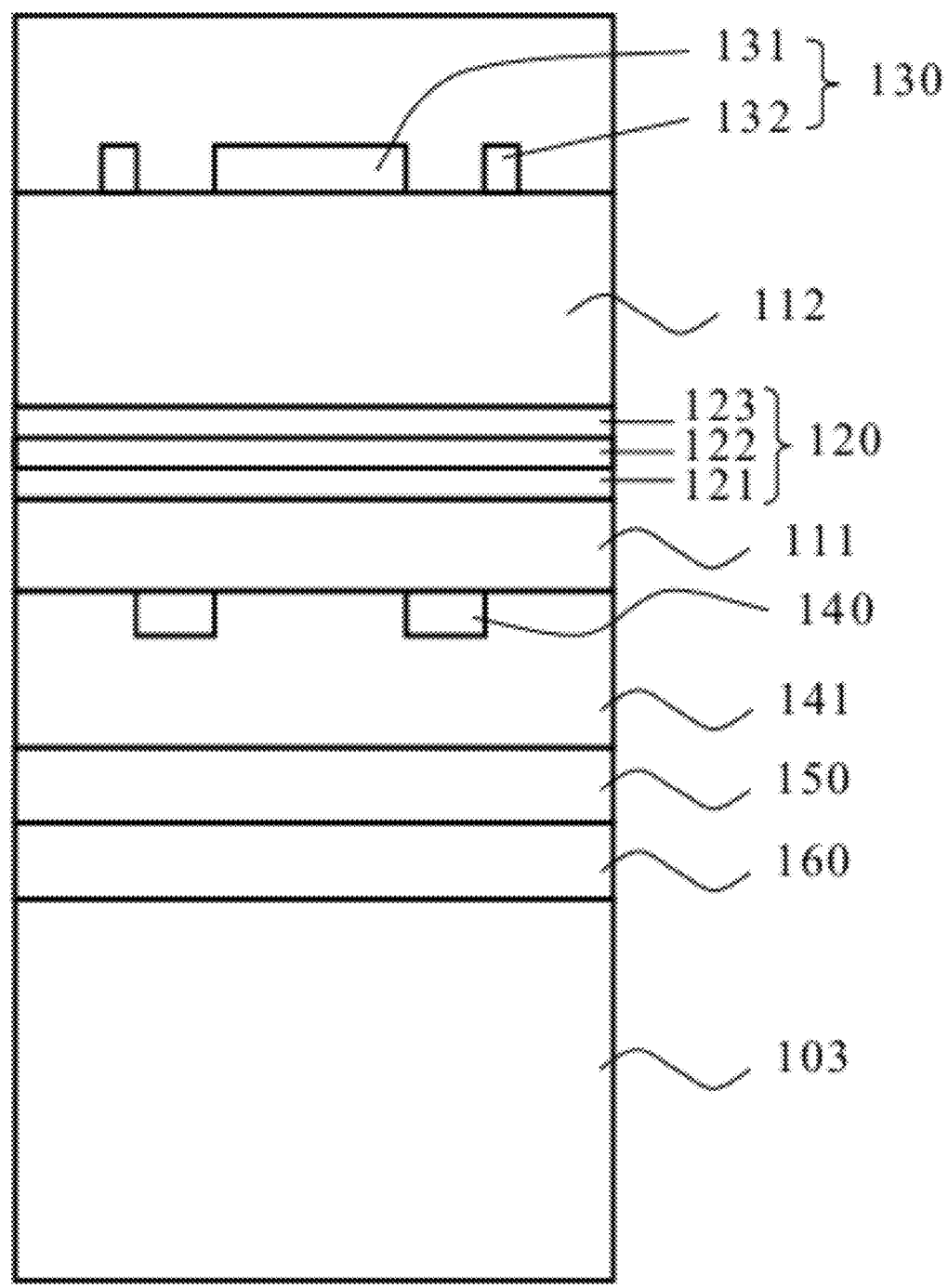

Next, a reflecting layer 150 is formed with a conductive material comprising metal, such as Ag, on the transparent conductive layer 141 as shown in FIG. 1E, and then the reflecting layer 150 is bonded to a supporting substrate 103 by a metal layer 160 as shown in FIG. 1F. In this embodiment, the supporting substrate 103 comprises Si, and the metal layer 160 served as a bonding layer comprises at least one material selected from the group consisting of In, Au, Sn, Pb, InAu, SnAu, and the alloy thereof.

Figure 1G:
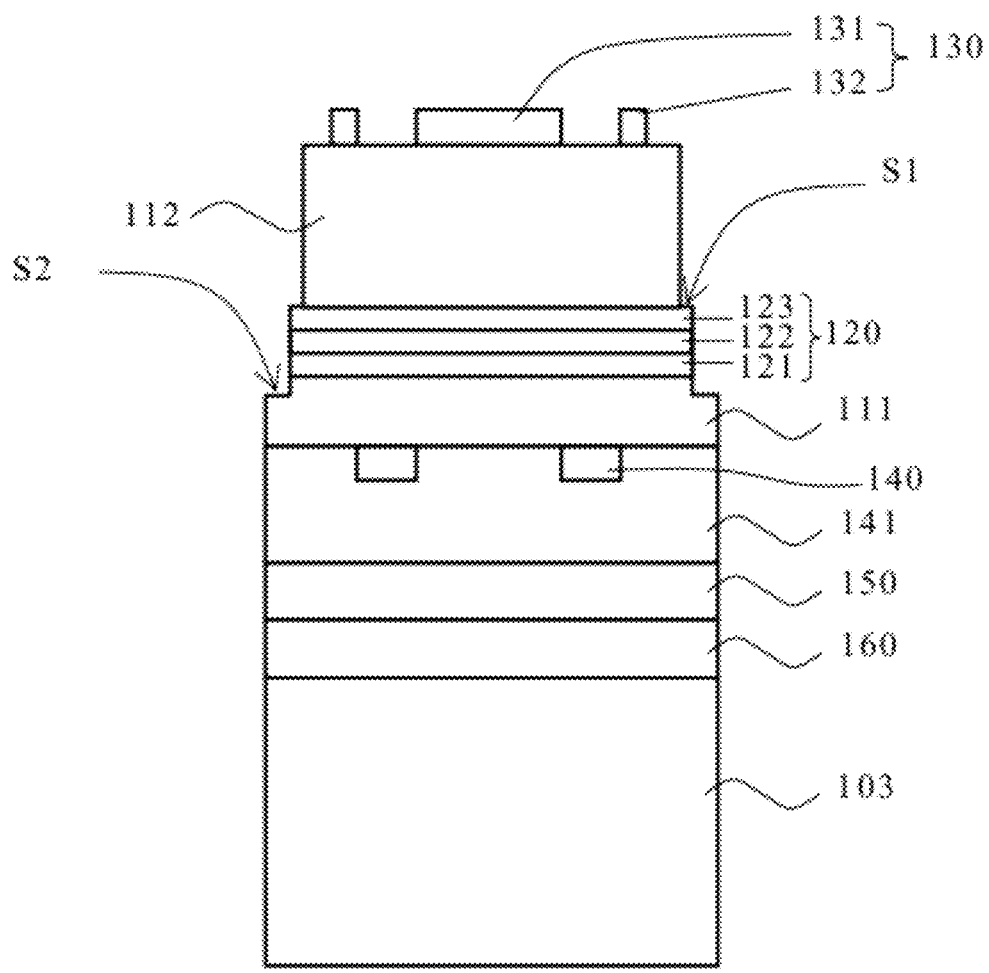

Next, the temporary substrate 102 is removed to expose the first ohmic contact layer 130 and the second window layer 112, and therefore forming a third stack structure. Then the third stack structure is patterned by the lithographic-etching process to form a plurality of chip areas (not shown) on the supporting substrate 103, wherein the etchants of the etching process, e.g. dry-etching chemicals comprising fluoride or chloride etch the second window layer 112 relatively faster than the optoelectronic system 120 such that a first mesa region S1 is formed on the surface of the optoelectronic system 120 or the second layer 123, and the width of the optoelectronic system 120 or the second layer 123 is larger than the width of the second window layer 112 at the interface of the optoelectronic system 120 or the second layer 123 and the second window layer 112 as indicated in FIG. 1G. It can also be noted that a second mesa region S2 is formed on the surface of the first window layer 111, and the bottom width of the first window layer 111 is larger than the optoelectronic system 120 or the first layer 121.

Figure 1H:
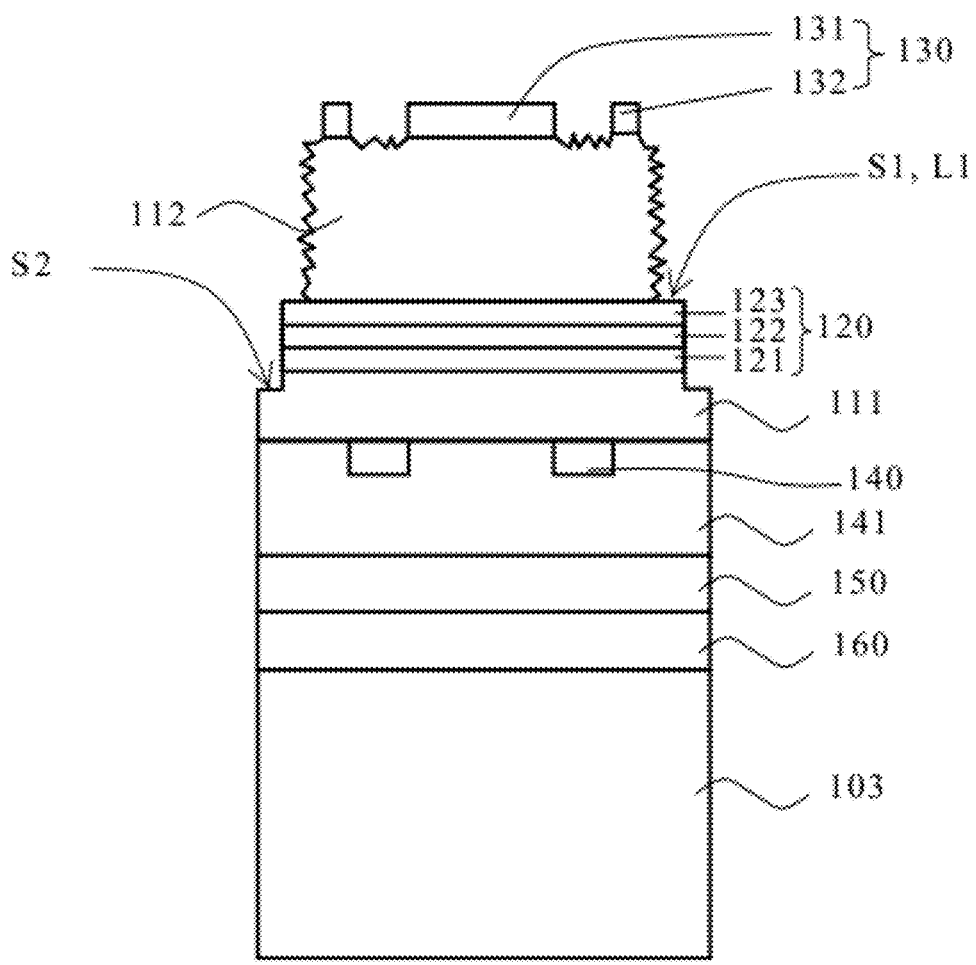

Next, at least the exposed top and sidewall surfaces of the second window layer 112 is wet etched such that the exposed top and sidewall surfaces of the second window layer 112 are roughened, wherein the etching solution, such as a mixture of hydrofluoric acid (HF), nitric acid ($HNO_3$), and acetic acid ($CH_3COOH$), etches the second window layer 112 relatively faster than the optoelectronic system 120 such that the width difference L1 is further expanded and become larger, and the second window layer 112 has an enhanced surface roughness higher than that of the optoelectronic system 120, and wherein the width difference L1 is greater than 1 micron and/or less than 10 microns as indicated in FIG. 1H or FIG. 3.

Figure 2:
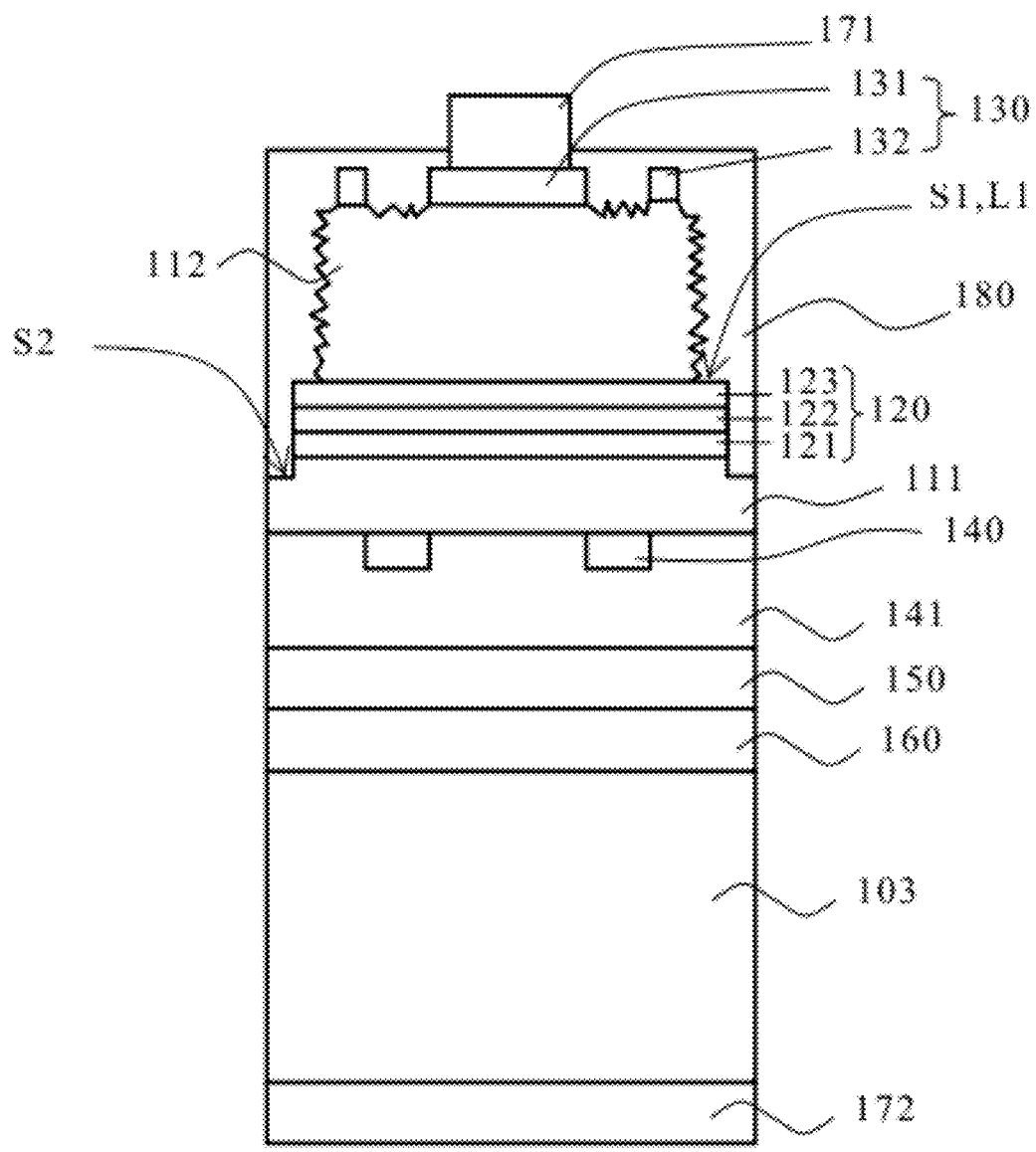
FIG. 2 illustrates an optoelectronic device according to one embodiment of the present disclosure.

Finally, a first pad 171 is formed on the first ohmic contact layer 130, a second pad 172 is formed on the supporting substrate 103, and a passivation layer 180 covers the second window layer 112 and the first ohmic contact layer 130 to form the optoelectronic device in accordance with the present disclosure as shown in FIG. 2. The passivation layer 180 serves as a protection layer to protect the optoelectronic device from environment damage, such as moisture, or mechanical damage. The SEM photograph of the optoelectronic device according to one embodiment of the present disclosure is demonstrated as in FIG. 3.

According to one embodiment of the present disclosure, the first window layer 111 comprises semiconductor material, such as $(Al_xGa_{(1-x)})_{0.5}In_{0.5}P$ where $0.5 \leq x \leq 0.8$, and the reflecting layer 150 comprising a metal element, e.g. Ag, is formed after the first and second alloying process such that the metal element in the reflecting layer is less diffused into the first window layer 111, where the first window layer 111 comprises a semiconductor material, preferred a material with substantially the same composition to the first layer 121. According to another embodiment of the present disclosure, the atomic concentration of the metal element in the first window layer is less than $1*10^{17}$ cm$^{-3}$ and the atomic concentration of the metal element is greater than $1*10^{16}$ cm$^{-3}$, therefore causing less degradation to the reflecting layer. The reflecting layer has a reflectivity greater than 90%.

Table 1 shows the optical efficiencies tested under given conditions by the optoelectronic device of the present disclosure. For an optoelectronic device with a small chip size, such as 10 mil$^2$, the optical efficiency is as high as about 70 lumen/watt under 20 mA or 0.2 mA/mil$^2$ of driving current. For an optoelectronic device with a relative smaller chip size, such as 14 mil$^2$, the optical efficiency is as high as about 100 lumen/watt under 20 mA or 0.1 mA/mil$^2$ of driving current. For an optoelectronic device with a relative larger chip size, such as 28 mil$^2$, the optical efficiency is as high as about 106 lumen/watt under 250 mA or 0.32 mA/mil$^2$ of driving current. For an optoelectronic device with a large chip size, such as 42 mil$^2$, the optical efficiency is as high as about 121 lumen/watt under 350 mA or 0.2 mA/mil$^2$ of driving current. It can be observed from table 1 that the optoelectronic device according to the embodiment of the present disclosure achieves an optical efficiency at least 70 lumen/watt, or preferred at least 100 lumen/watt at a driving current density ranging from 0.1~0.32 mA/mil$^2$.

TABLE 1 the optical efficiencies tested under given conditions according to the optoelectronic device of the present disclosure.

| Chip size [mil$^2$] | Operating current [mA] | Current density [mA/mil$^2$] | Optical efficiency [lumen/watt] | Dominant wavelength [nm] |
| --- | --- | --- | --- | --- |
| 10 | 20 | 0.2 | ~70 | ~620 |
| 14 | 20 | ~0.1 | ~90 | ~620 |
| 28 | 250 | ~0.32 | ~106 | ~613 |
| 42 | 350 | ~0.2 | ~121 | ~613 |

According to the present disclosure, the sheet resistance of the first window layer 111 is higher than that of the second window layer 112. Also, the second ohmic contact layer 140 substantially does not overlap with the first ohmic contact layer 130 in vertical direction. Therefore, the driving current is crowding nearby the second ohmic contact layer 140. The light emitted by the optoelectronic device is corresponding to the region of the second ohmic contact layer 140 and is not blocked by the first ohmic contact layer 130, and therefore having the effect of current blocking and benefit to lateral current spreading.

According to another embodiment of the present disclosure, the first window layer 111 comprises a lower impurity concentration than that of the second window layer 112 to have a lower sheet resistance than that of the second window layer 112. According to another embodiment of the present disclosure, the first window layer 111 comprises an n-type impurity with an impurity concentration of around $1\times10^{17} \sim 5\times10^{17}$ cm$^{-3}$, and the second window layer 112 comprises a p-type impurity with an impurity concentration of $1\times10^{18} \sim 5\times10^{18}$ cm$^{-3}$ higher than that of the first window layer 111. According to another embodiment of the present disclosure, the thickness of the first window layer between 1~5 microns is smaller than the thickness of the second window layer 112 between 5~20 microns.

According to one embodiment of the present disclosure, because the sidewall surfaces of the second window layer 112 are roughened, the light can be laterally extracted easily. The chip areas can be rectangle in shape for better luminous efficiency. The ratio of the length to the width of the rectangle is preferred from 1.5:1 to 10:1.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present application has been explained above, it is not the limitation of the range, the sequence in practice, the material in practice, or the method in practice. Any modification or decoration for present application is not detached from the spirit and the range of such.

What is claimed is:

1. An optoelectronic device comprising:
   a semiconductor stack having a first side and a second side opposite to the first side;
   a first contact layer on the first side;
   a second contact layer being on the second side and not overlapped with the first contact layer in a vertical direction; and
   borders,
   wherein the second contact layer comprises a plurality of dots separated from each other and arranged in a two-dimensional array.

2. The optoelectronic device of claim 1, wherein the semiconductor stack comprises:
   a first semiconductor layer of a first conductivity-type;
   a second semiconductor layer of a second conductivity-type; and
   a conversion unit between the first semiconductor layer and the second semiconductor layer.

3. The optoelectronic device of claim 1, wherein the first contact layer comprises a plurality of fingers extending toward the borders.

4. The optoelectronic device of claim 1, wherein at least one of the first contact layer and the second contact layer comprises an alloy.

5. The optoelectronic device of claim 1, wherein at least one of the first contact layer and the second contact layer comprises BeAu or GeAu.

6. The optoelectronic device of claim 1, further comprising a substrate; and a bonding layer between the semiconductor stack and the substrate.

7. The optoelectronic device of claim 1, further comprising a first pad on the first contact layer.

8. The optoelectronic device of claim 7, wherein the plurality of dots is not covered by the first pad.

9. The optoelectronic device of claim 1, further comprising a second pad on the substrate.

10. The optoelectronic device of claim 1, wherein the first contact layer comprises a finger parallel to one of the borders.

11. The optoelectronic device of claim 1, wherein the semiconductor stack has a top surface being rough.

12. The optoelectronic device of claim 1, wherein the semiconductor stack has a sidewall being rough.

13. The optoelectronic device of claim 1, wherein the semiconductor stack has a sidewall comprising a rough portion and a flat portion.

14. The optoelectronic device of claim 13, wherein the rough portion and the flat portion have different materials.

15. The optoelectronic device of claim 13, wherein the rough portion is oblique.

16. The optoelectronic device of claim 1, wherein the semiconductor stack has a top surface comprising a rough area and a flat area.

17. The optoelectronic device of claim 16, wherein the first contact layer is corresponding to the flat area.

18. The optoelectronic device of claim 6, further comprising a reflecting layer between the semiconductor stack and the bonding layer.

19. The optoelectronic device of claim 18, wherein the reflecting layer comprises a metal and has a reflectivity greater than 90%.

* * * * *